(12) United States Patent
Hennus et al.

(10) Patent No.: US 7,405,810 B2
(45) Date of Patent: Jul. 29, 2008

(54) METHOD AND APPARATUS FOR POSITIONING A SUBSTRATE ON A SUBSTRATE TABLE

(75) Inventors: Pieter Renaat Maria Hennus, Peer (BE); Jacob Willem Vink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 796 days.

(21) Appl. No.: 10/875,537

(22) Filed: Jun. 25, 2004

(65) Prior Publication Data

US 2005/0018167 A1   Jan. 27, 2005

(30) Foreign Application Priority Data

Jun. 27, 2003   (EP)   ................... 03077016

(51) Int. Cl.
*G03B 27/62* (2006.01)
*G03B 27/42* (2006.01)
*G03B 27/32* (2006.01)

(52) U.S. Cl. .............................. 355/75; 355/53; 355/77; 356/400

(58) Field of Classification Search .................. 355/53, 355/72, 75, 77; 356/399, 400, 401; 382/141, 382/143, 151; 430/22

See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,523,193 | A | 6/1996 | Nelson |
| 5,969,441 | A | 10/1999 | Loopstra et al. |
| 6,046,792 | A | 4/2000 | Van Der Werf et al. |
| 6,188,467 | B1 | 2/2001 | Yamatsu et al. |
| 6,778,258 | B2 * | 8/2004 | del Puerto et al. ............. 355/72 |
| 2001/0014170 | A1 * | 8/2001 | Willems van Dijk et al. ..... 382/151 |
| 2001/0022652 | A1 * | 9/2001 | van Schaik et al. ........... 355/53 |

FOREIGN PATENT DOCUMENTS

| EP | 1 124 162 A2 | 8/2001 |
| EP | 1 304 727 A2 | 4/2003 |
| JP | 2003-059809 | 2/2003 |
| WO | 98/33096 | 7/1998 |
| WO | 98/38597 | 9/1998 |
| WO | 98/40791 | 9/1998 |

OTHER PUBLICATIONS

European Search Report dated Apr. 23, 2004, for EP 3077016.

* cited by examiner

*Primary Examiner*—Alan A Mathews
(74) *Attorney, Agent, or Firm*—Pillsbury Winthrop Shaw Pittman, LLP

(57) ABSTRACT

The invention relates to a method for positioning a substrate relative to a substrate table, is presented. When the substrate is positioned on the substrate table for a first time, a first relative position of the substrate with respect to the substrate table is determined. When the substrate is positioned on the substrate table a second subsequent time, a second relative position of the substrate with respect to the substrate table is determined and the position of the substrate table with respect to the substrate is adjusted based on the first and second relative positions, so that the substrate is positioned with respect to the substrate table substantially equally to the first relative position.

17 Claims, 2 Drawing Sheets

METHOD AND APPARATUS FOR POSITIONING A SUBSTRATE ON A SUBSTRATE TABLE

BACKGROUND OF THE INVENTION

1. Priority Information

This application claims priority from European Patent Application No. 03077016.8, filed Jun. 27, 2003, herein incorporated by reference in its entirety.

2. Field of the Invention

The present invention relates to an apparatus for positioning a substrate, a method for positioning a substrate relative to a substrate table, and an associated device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder parallel or anti-parallel to this direction. Since, in general, the projection system will have a magnification factor M (generally <1), the speed V at which the substrate table/holder is scanned will be a factor M times that at which the mask table/holder/holder is scanned. More information with regard to lithographic devices as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate table/holders (and/or two or more mask table/holders). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

During the lithographic process, a substrate is often subjected to multiple exposures or sets of exposures. In between successive exposures or sets of exposures, the substrate is taken from the substrate table and typically out of the lithographic apparatus to undergo further processing, such as a post-exposure bake (PEB), development, a hard bake and measurement/inspection of the imaged features, as already stated above. After such processing, the substrate is often transported back to the substrate table for a next exposure or set of exposures. The result of such a procedure is, for example, multiple layers on a substrate.

The substrate is transported to and from the substrate table using, for instance, a robot arm. The robot arm is arranged to grip a substrate at a certain position, move the substrate, and release the substrate at another position. When the robot arm hands over the substrate to the substrate table, the substrate should be positioned with great accuracy. Therefore, the position (rotation and/or translation) of the substrate with respect to the robot arm needs to be accurately determined.

The determination of the position of the substrate relative to the robot arm is typically done with the use of a pre-aligner. The pre-aligner measures the substrate position and the substrate is positioned with respect to the robot arm for transport to the substrate table. Thus, the pre-aligner ensures that the relative position of the substrate with respect to the robot arm is known, so that the robot arm can accurately deliver the substrate to the substrate table.

At the substrate table, the robot arm typically provides the substrate to one or more pins of the substrate table. The pins of the substrate table displace the substrate to the supporting surface of the substrate table. Consequently, the positional accuracy of the substrate on the substrate table surface are limited by the measuring accuracy of the pre-aligner and the hand-over by the robot arm to the pin(s) and by the pin(s) to the substrate table surface.

After the substrate is positioned on the substrate table surface, the positional error (translational, rotational) of the substrate orientation relative to the substrate table orientation is determined. This is typically done, for instance, by using an alignment system to measure the position of two marks provided on the substrate and two marks provided on the substrate table or a chuck, on which the substrate is supported. If the marks are out of the range of the alignment system, the substrate is removed from the substrate table and optionally replaced on the substrate table after a further pre-alignment. If the marks are within the measurement range of the alignment system, the positional error between the orientation of the substrate and the orientation of the substrate table is measured and determined. This positional error is used by the substrate table/chuck positioning and position measurement means to ensure that the patterned beam is projected correctly onto the substrate.

In some circumstances, the substrate table/chuck is rotated to adjust for the above-referenced positional error in order that the patterned beam is correctly projected onto the substrate. However, it will be understood by a person skilled in the art that a rotation of the substrate table/chuck can introduce errors in the measurement performed by an interferometer position measurement means, since the surface of a mirror mounted on the substrate table/chuck and used by the interferometer position measurement means may no longer be perpendicularly positioned with respect to the interferometer position measurement means. As will be understood, this can lead to overlay errors where the positional error is different between an exposure or set of exposures and a subsequent exposure or set of exposures.

Furthermore, despite the pre-alignment and hand-over described above, the positioning of the substrate on the substrate table may not be exactly the same for a next exposure or set of exposures, since the position of the substrate with respect to a support structure (e.g. a pimple pattern) on the substrate table may be different for the next exposure or set of exposures due to inaccuracies of the pre-aligner and inaccurate substrate-handling processes. Such differing positions can lead to overlay errors. For example, a local inaccuracy in the support structure of the substrate table could cause a local deformation in the top surface of the substrate. If the position of the substrate with respect to the support structure is different for a next exposure or set of exposures, the deformation in the top surface of the substrate may be different for such next exposure or set of exposures. This could possibly lead to overlay errors as will be understood by a person skilled in the art.

SUMMARY OF THE INVENTION

The principles of the present invention, as embodied and broadly described herein, provide a method for positioning a substrate relative to a substrate holder, comprising determining a first relative position of the substrate with respect to the substrate holder when the substrate is positioned relative to the substrate holder for a first time; determining a second relative position of the substrate with respect to the substrate holder when the substrate is positioned relative to the substrate holder a second time; and adjusting the position of the substrate holder with respect to the substrate based on the first and second relative positions, such that the second time the substrate is positioned relative to the substrate holder it is substantially equal to the first relative position.

Performing this method allows a substrate to be transferred in a repeated fashion to a substantially same relative position with respect to the substrate table. As a result, a support structure on the substrate table may consistently support the same points of a substrate, causing perhaps similar positional errors of the substrate during successive exposures or sets of exposures, but reducing or avoiding overlay errors.

According to an embodiment of the invention, the second relative position of the substrate is determined after the substrate is delivered to the substrate table and the method further comprises removing the substrate from the substrate table, adjusting the position of the substrate table with respect to the substrate based on the first and second relative positions, and delivering the substrate to the repositioned substrate table.

This is a simple and straightforward way of positioning a substrate on the substrate table in accordance with previous relative positioning.

According to an embodiment of the invention, the substrate table is provided with a displacement device for displacing the substrate to and from the substrate table and the method further comprises removing the substrate from the substrate table with the displacement device, adjusting the position of the substrate table with respect to the displacement device and the substrate based on the first and second relative positions, and delivering the substrate to the repositioned substrate table with the displacement device.

A displacement device (e.g., pins) provided to the substrate table is suited to displace the substrate to and from the substrate table to enable an adjustment of the substrate table with respect to the substrate. Such devices are usually already incorporated in a substrate table.

According to an embodiment of the invention, the method further comprises: determining the second relative position of the substrate before the substrate is delivered onto the substrate table, and adjusting the position of the substrate table with respect to the substrate based on the first and second relative positions before the substrate is delivered to the substrate table.

The adjustment of the relative position of the substrate table with respect to the substrate may be performed more time efficiently by adjusting the relative position of the substrate with respect to the substrate table before the substrate is delivered to the substrate table. This method typically employs a measuring device that is capable of determining the relative position of the substrate with respect to the substrate table, before the substrate is actually on the substrate table.

According to an embodiment of the invention, the substrate table is provided with a displacement device for displacing the substrate to and from the substrate table and the method further comprises: determining the second relative position of the substrate before the substrate is delivered to the substrate table by the displacement device, and adjusting the position of the substrate table with respect to the substrate before the substrate is delivered to the substrate table by the displacement device.

A displacement device (e.g., pins) provided to the substrate table is suited to deliver the substrate to the substrate table. Such a displacement device is usually already incorporated in a substrate table.

According to an embodiment of the invention, the position of the substrate on the substrate table is measured using an alignment system and the relative position of the substrate before the substrate is delivered to the substrate table is measured with an additional alignment system, such as a CCD-camera. An additional alignment system, such as a CCD-camera, is a relatively time-efficient way to facilitate the adjusting of the position of the substrate table with respect to the substrate so that the substrate is positioned with respect to the substrate table at the second subsequent time substantially equally to the first relative position.

According to an embodiment of the invention, the position of the substrate table is determined using an interferometric measurement device that cooperates with a mirror attached to at least one of a chuck and the substrate table and wherein the position of the mirror with respect to the interferometric measurement system is chosen to be substantially perpendicular when the first relative position of the substrate with respect to the substrate table is determined.

During each subsequent positioning of the substrate, the mirror will be perpendicular with respect to the interferometric measurement system. It will be appreciated by a person skilled in the art that this substantially perpendicular arrangement will ensure optimal results of the measurements performed by the interferometric measurement system.

According to a further aspect, the invention relates to a device manufacturing method comprising providing a substrate that is at least partially covered by a layer of radiation-sensitive material; positioning the substrate relative to a substrate holder, wherein the positioning comprises: determining a first relative position of the substrate with respect to the substrate holder when the substrate is positioned relative to the substrate holder for a first time; determining a second relative position of the substrate with respect to the substrate holder when the substrate is positioned relative to the substrate holder a second time; and adjusting the position of the substrate holder with respect to the substrate based on the first and second relative positions, such that the second time the substrate is positioned relative to the substrate holder it is substantially equal to the first relative position. The device manufacturing method further comprises conditioning a beam of radiation using a radiation system; providing a support configured to support a patterning device; configuring the beam of radiation with a desired pattern in its cross-section based on the patterning device; and projecting the patterned beam of radiation onto a target area of the layer of radiation-sensitive material.

The method according to the invention can advantageously be used in a device manufacturing method as described above. In such device manufacturing methods the positioning of a substrate should be very accurate in order to reduce overlay errors and further enhance the quality of the devices produced.

According to a further embodiment, the present invention relates to an apparatus for positioning a substrate, comprising a substrate holder for holding the substrate; a carrier including a displacement device that displaces the substrate to and from the substrate holder; a positioning device that displaces the substrate holder relative to the carrier; and an alignment system configured to determine a first relative position of the substrate with respect to the substrate holder when the substrate is positioned relative to the substrate holder for a first time and to determine a second relative position of the substrate with respect to the substrate holder when the substrate is positioned relative to the substrate holder a second subsequent time. The positioning device is configured to adjust the position of the substrate holder with respect to the substrate based on the first and second relative positions, such that the second time the substrate is positioned relative to the substrate holder it is substantially equal to the first relative position.

According to an embodiment of the invention, the substrate table comprises a support structure formed by a plurality of pimples. Such a pimple structure is often used to support substrates, since such a pimple structure reduces the contact area between the substrate and the substrate table and thus also reduces the risk for contamination particles to disturb the exact positioning of the substrate. A small inaccuracy in the pimple pattern, for instance a pimple being slightly higher than the other pimples, will cause a local deformation of the substrate surface. Therefore, the method according to the invention can advantageously be used in an apparatus comprising such a pimple pattern.

In another embodiment, the present invention relates to a lithographic apparatus, comprising a radiation system configured to condition a beam of radiation; a support structure configured to support a patterning device that imparts a desired pattern to the beam of radiation; a substrate holder configured to hold a substrate; and a projection system configured to project the patterned beam onto a target portion of the substrate. The projection system includes a substrate positioning apparatus, comprising a carrier including a displacement device that displaces the substrate to and from the substrate holder; a positioning device that displaces the substrate holder relative to the carrier; and an alignment system configured to determine a first relative position of the substrate with respect to the substrate holder when the substrate is positioned relative to the substrate holder for a first time and to determine a second relative position of the substrate with respect to the substrate holder when the substrate is positioned relative to the substrate holder a second subsequent time. The positioning device is configured to adjust the position of the substrate holder with respect to the substrate based on the first and second relative positions, such that the second time the substrate is positioned relative to the substrate holder it is substantially equal to the first relative position.

In lithographic projection apparatus the positioning of the substrate needs to be very accurate, so the invention as discussed above can advantageously be used in such a lithographic projection apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
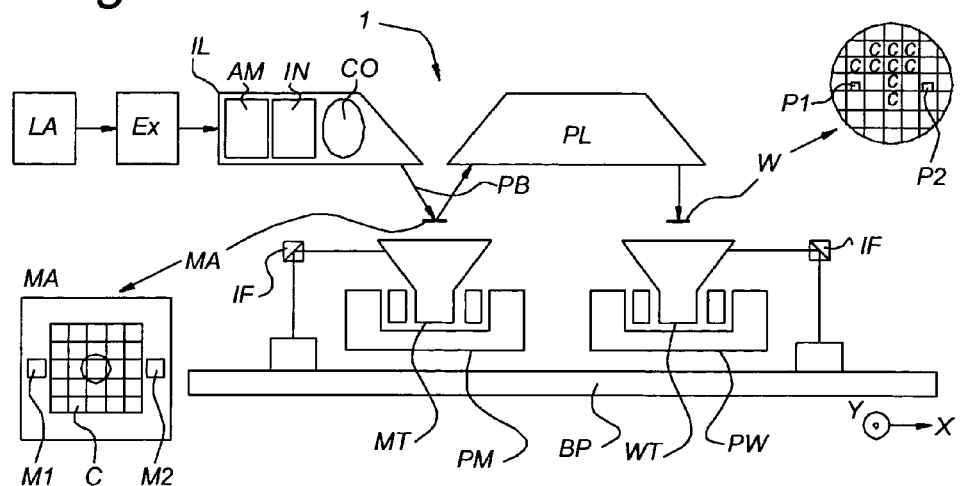
FIG. 1 depicts a lithographic projection apparatus, according to an embodiment of the invention.

FIG. 1 schematically depicts a lithographic projection apparatus according to an embodiment of the invention. The apparatus comprises:
- a radiation system Ex, IL: for supplying a projection beam PB of radiation (e.g. EUV, DUV, or UV radiation). In this particular case, the radiation system also comprises a radiation source LA;
- a first object table (mask table/holder/holder) MT: provided with a mask holder for holding a mask MA (e.g. a reticle), and connected to first positioning mechanism for accurately positioning the mask with respect to item PL;
- a second object table (substrate table/holder) WT: provided with a substrate holder for holding a substrate W (e.g. a resist-coated silicon wafer), and connected to second positioning mechanism for accurately positioning the substrate with respect to item PL;
- a projection system ("lens") PL: for example, a mirror or refractive lens system that images an irradiated portion of the mask MA onto a target portion C (comprising one or more dies) of the substrate W.

As depicted here, the apparatus may be of a reflective type, for example, having a reflective mask, or may be of a transmissive type, for example, having a transmissive mask. Alternatively, the apparatus may employ another kind of patterning device, such as a programmable mirror array of a type as referred to above.

The source LA (e.g. a Hg lamp, an excimer laser, an undulator or wiggler provided around the path of an electron beam in a storage ring or synchrotron, a laser-produced plasma source or otherwise) produces a beam of radiation. This beam is fed into an radiation system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table/holder MT. Having been selectively reflected by the mask MA, the beam PB passes through the projection system PL, which focuses the beam PB onto a target portion C of the substrate W. With the aid of the second positioning mechanism PW (and interferometric measuring mechanism IF), the substrate table/holderWT can be moved accurately, e.g. so as to position different target portions C in the path of the beam PB.

Similarly, the first positioning mechanism PM can be used to accurately position the mask MA with respect to the path of the beam PB, e.g. after mechanical retrieval of the mask MA from a mask library, or during a scan. Depending on the source LA that is used, the mask table/holder MT, the projection system PL and the substrate table/holder WT may be enclosed by a vacuum chamber.

In general, movement of the object tables MT, WT will be realized with the aid of a long-stroke module (coarse positioning) and a short-stroke module (fine positioning), which are not explicitly depicted in FIG. 1. As an example, the first positioning mechanism may comprise of a first positioning device, e.g. a linear motor system, for displacing the mask MA over comparatively large strokes (coarse positioning), while a second position device, e.g. a second linear motor system, comprising of a plurality of actuators and mounted on the first linear motor allows an accurate positioning of the mask MA in six degrees of freedom over comparatively small strokes (fine positioning). However, in the case of a wafer stepper (as opposed to a step-and-scan apparatus) the mask table/holder MT may just be connected to a short stroke actuator, or may be fixed. Mask MA and substrate W may be aligned using mask alignment marks M1, M2 and substrate alignment marks P1, P2.

The apparatus depicted in FIG. 1, can be used in different modes:

step mode: the mask table MT is kept essentially stationary, and an entire mask image is projected in one go (i.e. a single "flash") onto a target portion C. The substrate table/holder WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed $\upsilon$, so that the projection beam PB is caused to scan over a mask image; concurrently, the substrate table/holder WT is simultaneously moved in the same or opposite direction at a speed $V=M\upsilon$, in which M is the magnification of the lens PL (typically, $M=\frac{1}{4}$ or $\frac{1}{5}$). In this manner, a relatively large target portion C can be exposed, without having to compromise on resolution; and other mode: the mask table MT is kept essentially stationary holding a programmable patterning device, and the substrate table/holder WT is moved or scanned while a pattern imparted to the projection beam is projected onto a target portion C. In this mode, generally a pulsed radiation source is employed and the programmable patterning device is updated as required after each movement of the substrate table/holder WT or in between successive radiation pulses during a scan. This mode of operation can be readily applied to maskless lithography that utilizes programmable patterning device, such as a programmable mirror array of a type as referred to above.

Figure 2:
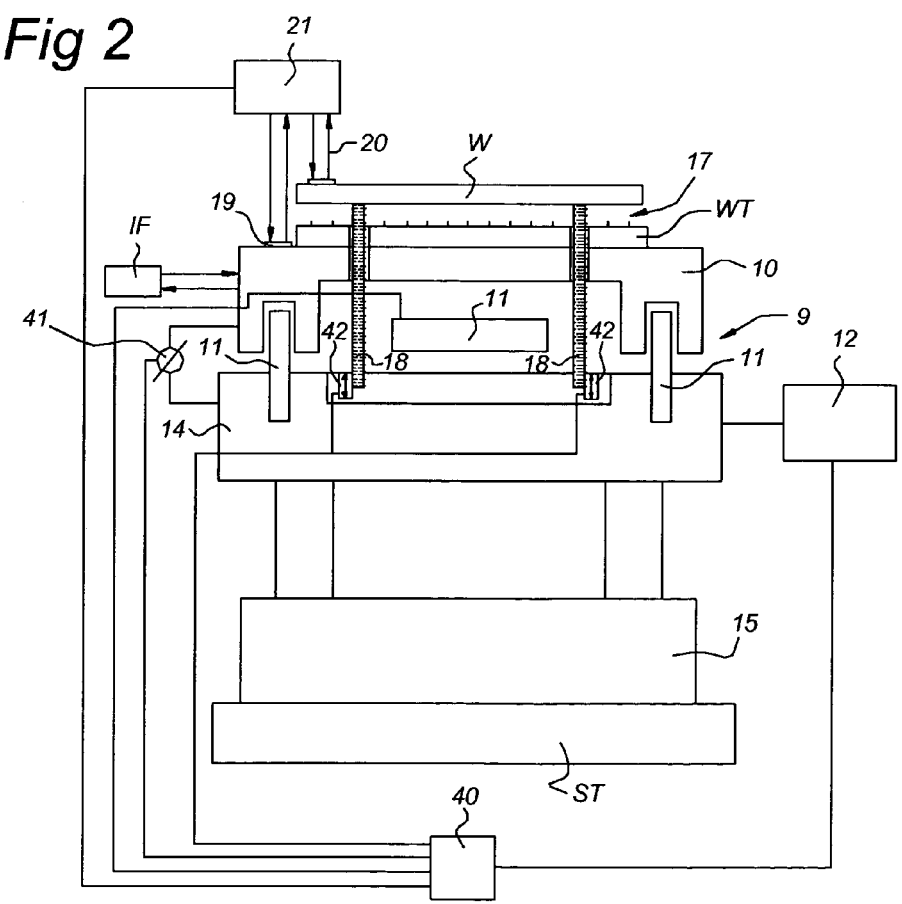
FIG. 2 depicts a schematic side view of a substrate stage, according to an embodiment of the present invention.

FIG. 2 depicts a cross sectional schematic view of a substrate stage 9 according to an embodiment of the present invention. In this embodiment, the substrate stage 9 comprises a chuck 10. The position (rotation and/or translation) of the chuck 10 and the substrate table/holder WT, described in more detail hereafter, (and hence of the substrate stage 9) is measured by one or more position measuring devices, such as an interferometric measuring device IF, shown in FIG. 2.

The chuck 10 is mounted on a carrier 14. The chuck 10 is displaceable by one or more short stroke positioning devices 11. Particularly, the chuck 10 is displaceable with respect to the carrier 14 by the short stroke positioning device(s) 11. The short stroke positioning device(s) can displace the chuck 10 in up to and including six degrees of freedom and may comprise one or more Lorentz actuators. A sensor 41 is provided to detect the relative position (rotation and/or translation) of the chuck 10 to the carrier 14 or vice versa. The detected position of the sensor 41 is provided to processing unit 40 (described in more detail hereafter) and can be used to facilitate displacement of the chuck 10 relative to the carrier 14 by the short stroke positioning device(s) 11.

The carrier 14 further comprises a foot 15. The foot 15 is supported on and movable across a surface ST, typically representing the fixed world. In an embodiment, the foot 15 comprises a gas bearing to facilitate movably supporting the foot 15 on the surface ST. The carrier 14 is displaceable by one or more long stroke positioning devices 12. The long stroke positioning device(s) 12 may comprise one or more linear motors and/or a planar motor. The long stroke positioning device(s) 12 can displace the chuck 10/carrier 14 in up to and including six degrees of freedom although typically it moves the chuck 10/carrier 14 in X, Y and optionally Rz.

The position of the chuck 10 can be adjusted by means of the short stroke positioning device(s) 11 and/or the long stroke positioning device(s) 12. The short stroke positioning device(s) 11 can be positioned with an accuracy of nms, while the long stroke positioning device(s) 12 can be positioned with an accuracy of μms. The short stroke positioning device(s) 11 and the long stroke positioning device(s) 12 may both be connected to a processing unit 40, that controls the short stroke positioning device(s) 11 and the long stroke positioning device(s) 12. Also the interferometric measurement device(s) IF is connected to the processing unit 40. The processing unit 40 may control the short stroke positioning device(s) 11 and/or the long stroke positioning device(s) 12 based on the measurements received from the interferometric measurement device(s) IF and/or the sensor 41.

As a result, the position of the chuck 10 can be adjusted with great accuracy within a relatively long range. It will be understood that suitable processing and communication devices may be provided for performing and coordinating the movement of the substrate stage 9, including chuck 10. These devices are not further explained and shown, since they are known to a person skilled in the art.

Figure 3:
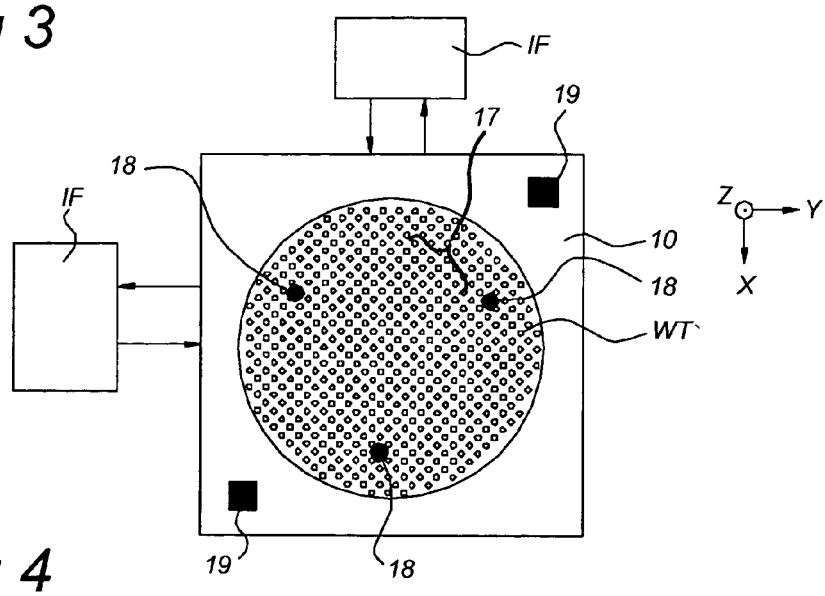
FIG. 3 depicts a schematic top view of a substrate table and a chuck, according to an embodiment of the present invention.

The substrate stage 9 further comprises a substrate table/holder WT, which is provided on the chuck 10, as shown in a top view in FIG. 3. The substrate table/holder WT is arranged to receive and support a substrate W. Therefore, the substrate table/holder WT is provided with a support structure, e.g. here depicted as a pimple pattern, formed by a plurality of pimples 17. The pimples 17 support the substrate W and reduce the contact area of the substrate table/holder WT and the substrate W.

The substrate W is put on the substrate table with the use of one or more displacement devices 18, preferably three pins 18. The pins 18 are connected to the carrier 14 and extend through recesses in the chuck 10 and the substrate table/holder WT. The diameter of the recesses is larger than the diameter of the pins 18. This allows the chuck 10 to make small lateral (rotation and/or translation) movements with respect to the carrier 14, without disturbing the pins 18. The pins 18 can be moved up and down automatically, by suitable actuators 42, as is indicated by the arrows. The actuators 42 are connected to the processing unit 40, which controls the movement of the pins 18. When the pins 18 are up, a substrate W can be delivered to them by a robot arm (not shown). Then the pins 18 are lowered, and the substrate W is put on the support structure (e.g., pimple pattern) of the substrate table/holder WT. As will be apparent, the pins need not move up and down. Rather, they simply need to displace the substrate to or from the substrate table/holder WT.

When the substrate W is placed on the substrate table/holder WT for a first time (for example, for an exposure or set of exposures), the substrate W is usually positioned using a notch provided on the periphery of the substrate W, as will be known to a person skilled in the art. Once the substrate W is placed on the substrate table/holder WT for an exposure or set of exposures, the exposure system can project a projection beam PB onto the surface of the substrate W.

In situations where a substrate W is put on a substrate table/holder WT for the first time and the substrate W has no alignment marks, a plurality, preferably at least two, of such marks are exposed onto the substrate W. The marks 20 can be very accurately positioned on the substrate W (up to several nanometers) with respect to marks 19 provided on the chuck 10. The marks 20 are used in positioning of the substrate W in subsequent exposures or sets of exposures. The marks 19 on the chuck 10 can, for instance, be provided as a transmission image sensor, as will be known to a person skilled in the art. Also or instead, the marks 19 may be provided on the substrate table/holder WT.

In one embodiment, the substrate has a coordinate system (SCS) defined by the position of the marks 20 on the substrate, as is known to a person skilled in the art. Further, the substrate table/holder WT/chuck 10 has a coordinate system (STCCS) defined by the marks 19 and an interferometer mirror associated with the substrate table/holder WT/chuck 10, as is known to a person skilled in the art.

For the case where the substrate W, initially lacking marks 20, is first placed on the substrate table/holder WT and marks 20 are exposed onto the substrate W, the relative position of the substrate W with respect to the substrate table/holder WT/chuck 10 does not need to be measured as the marks 20 can be created in a very accurate manner with respect to the substrate table/holder WT/chuck 10. In such a circumstance, the relative position of the substrate to the substrate table/holder WT is determined to be zero. For example, the marks 20 can be exposed on the substrate such that the SCS and STCCS align, i.e., the origins and the direction of the axes of these two coordinate systems align, and so there is no position error of the substrate W with respect to the substrate table/holder WT/chuck 10.

Preferably, in those circumstances, the mirror(s) associated with the substrate table/holder WT/chuck 10 is positioned perpendicularly to the interferometer system IF. Alternatively, in such a first time when the marks 20 have been exposed onto the substrate, the relative position of the substrate with respect to the substrate table/holder WT/chuck 10 may be measured and determined using the alignment system 21 and the position of the substrate corrected relative to the substrate table/holder WT/chuck 10 as described in more detail below when a substrate W has marks 20 already provided.

When a substrate W is put on a substrate table/holder WT for a first time, but is already provided with marks 20 (for instance, from a previous exposure or set of exposures performed on another or the same substrate table/holder WT in the lithographic apparatus or in a separate machine), the alignment system 21 is used to measure and determine the relative position of the mark 20, provided on the substrate W, with respect to the mark 19, provided on the chuck 10 (or on the substrate table/holder WT). The measurement and determination of the relative position of marks 19 and 20 results in the determination of the relative position of the substrate with respect to the substrate table/holder WT. Preferably, a plurality of marks 19 and 20 are measured to determine the relative position of the substrate with respect to the substrate table/holder WT.

In one embodiment, when the substrate W having marks 20 is put on the substrate table/holder WT for the first time, it may be desired to correct the position of the substrate W relative to the substrate table/holder WT/chuck 10. Such a correction may be performed to have the substrate W oriented on the substrate table/holder WT so that the interferometer mirror associated with the substrate table/holder WT/chuck 10 may positioned in a substantially perpendicular manner to the interferometer system IF. In such a case, the measurement and determination of the relative position can comprise measurement and determination of whether the SCS and STCCS align, i.e., the origins and the direction of the axes of these two coordinate systems align. To substantially make the SCS and STCCS align, the substrate W can be displaced from the substrate table/holder WT by the pins 18. Then, the position of the chuck 10/substrate table/holder WT can be adjusted in such a way that the SCS and STCCS substantially align. In order to do this, the short stroke positioning device(s) displaces the substrate table/holder WT/chuck 10 relative to the carrier 14, the pins 18 and the substrate W.

After the SCS and STCCS have been made to substantially align, the substrate W is returned to the substrate table/holder WT. Now that the substrate W is properly oriented with respect to the substrate table/holder WT/chuck 10, the substrate table/holder WT/chuck 10 then can be displaced such that the interferometer mirror associated with the substrate table/holder WT/chuck 10 is substantially perpendicular to the interferometer system IF. The relative position of the substrate W with respect to the substrate table/holder WT can be determined again by the alignment system 21.

When a substrate W is put on the substrate table/holder WT at a second subsequent time for a next exposure or set of exposures, the alignment system 21 measures the relative position of the mark 19 provided on the chuck 10 (or substrate table/holder WT) with respect to the mark 20 provided on the substrate W. As a result of small inaccuracies in the substrate handling, the position of the substrate W with respect to the substrate table/holder WT as the second subsequent time may not be substantially the same as the position of the substrate W with respect to the substrate table/holder WT at the first time. This results in a position (rotation and/or translation) error.

As discussed above, correction of the rotation position error by simply rotating the chuck 10, having the substrate W thereon, can cause errors in the X-and Y-measurements of the interferometer system IF as the mirror(s) may not be perpendicular to the interferometer system. Also, since the substrate W may be positioned differently with respect to the support structure 17 at the second time, the shape of the top surface of the substrate W may not be the same, as during the exposure or set of exposures at the first time. This is a direct result of inaccuracies in the top and bottom surface of the substrate W and inaccuracies in the support structure. These differences can cause overlay errors between different exposed layers on the substrate W, as will be understood by a person skilled in the art.

Thus, in accordance with an embodiment of the present invention, after the relative position of the substrate W is measured with respect to the substrate table/holder WT at the second time, the substrate W is lifted from the substrate table/holder WT by the pins 18. Then, the position of the chuck 10 and the substrate table/holder WT is adjusted in such a way that the relative position of the substrate W with respect to the substrate table/holder WT, is substantially the same as the relative position of the substrate W with respect to the substrate table/holder WT as when the substrate W is put on the substrate table/holder WT during the first time.

In order to do this, the short stroke positioning device(s) moves the substrate table/holder WT/chuck 10 relative to the carrier 14, the pins 18 and the substrate W. After the relative position at the second time has been made the same as at the first time, the substrate W is lowered again to be supported by the substrate table/holder WT. Now that the substrate W has the same relative position with respect to the substrate table/holder WT/chuck 10 at the first time, the substrate table/holder WT/chuck 10 then can be displaced such that the interferometer mirror associated with the substrate table/holder WT/chuck 10 is substantially perpendicular to the interferometer system. This method is repeated for all subsequent exposures or sets of exposures.

In one embodiment, the position error can be corrected by making the SCS and STCCS align, i.e., the origins and the direction of the axes of these two coordinate systems align. To make the SCS and STCCS align, the substrate W can be displaced from the substrate table/holder WT by the pins 18 and the position of the chuck 10/substrate table/holder WT displaced in such a way that the SCS and STCCS align, as described in more detail above.

The result of any of these methods is that the positional errors of the substrate W at the second time, caused by inaccuracies in the shape of the substrate and the support structure, are substantially the same as during the exposure or set of exposures at the first time. Since these errors are the substantially the same, the influence of these errors are substantially the same for each exposed layer. Overlay errors can be reduced or avoided. Furthermore, since the position of the substrate W with respect to the substrate table/holder WT is substantially the same during each exposure or set of exposures, the position of the chuck 10 is also substantially the same for each exposure or set of exposures. This means that possible measurement errors by the interferometric measurement device(s) IF made during the first time are reproduced during a second subsequent time, so, for example, overlay errors are reduced.

This repositioning of the substrate W can be done every next (second) time the substrate is put on the substrate table/holder WT for a next exposure or set of exposures. The position of the substrate table/holder WT can be adjusted in the X-and Y-direction (see FIG. 3), as well as in the Rz-direction.

Thus, when a substrate W is put on the substrate table/holder WT for a first time, the relative position of the substrate W with respect to the substrate table/holder WT/chuck 10 (and thus the support structure) is measured. Every next time the substrate W is put on the substrate table/holder WT, the following may be performed:
  (a) deliver the substrate W to the pins 18;
  (b) deliver the substrate W to the substrate table/holder WT by, for example, lowering the pins 18;
  (c): measure the relative position of the substrate W with respect to the substrate table/holder WT with the alignment system 21;
  (d) deliver the substrate W from the substrate table/holder WT by, for example, raising the pins 18;
  (e) repositioning the substrate table/holder WT relative to the substrate W in such a way that the relative position of the substrate W with respect to the substrate table/holder WT is substantially equal to relative position of the substrate W to the substrate table/holder WT at the first time; and
  (f) delivering the substrate W to the substrate table/holder WT by, for example, lowering the pins 18.

According to a further embodiment of the invention, the position of the substrate W relative to the substrate table/holder WT is not measured when the substrate W is on the substrate table/holder WT, but when the robot arm has delivered the substrate W to the pins 18. The alignment system 21 determines the position of the substrate W, while being supported by the pins 18, in the X-, Y-and Rz-direction relative to the substrate table/holder WT and, before or during the displacing of the pins to deliver the substrate W to the substrate table/holder WT, the position of the substrate table/holder WT can be adjusted.

This is possible since adjustments to be made are expected to be small enough that the pins 18 will not engage the substrate table/holder WT while adjustment of the substrate table/holder WT is made. The substrate table/holder WT will thus receive the substrate W in the substantially same position as the previous times or in the case of correction of the orientation of the substrate W, in a position wherein the STC and STCCS substantially align.

Thus, when a substrate W is put on the substrate table/holder WT for a first time, the relative position of the substrate W with respect to the substrate table/holder WT while supported by the pins 18 is measured. So, for example, every next (second) time the substrate W is put on the substrate table/holder WT, the following steps are performed:
  (a) deliver the substrate W to the pins 18;
  (b) measure the relative position of the substrate W with respect to the substrate table/holder WT with the alignment system 21;
  (c) adjust the position of the substrate table/holder WT relative to the substrate W in such a way that the relative position of the substrate W with respect to the substrate table/holder WT is substantially equal to the relative position of the substrate W with respect to the substrate table/holder WT at the first time; and
  (d) deliver the substrate to the substrate table/holder WT by, for example, lowering the pins 18.

The above process can also be extended in the case of correction of the orientation of the substrate W, wherein the STC and STCCS are made to substantially align.

This embodiment has the advantage that fewer steps are required in comparison with the method described above and the delivery of the substrate W to the substrate table/holder WT can be performed quicker. However, the standard alignment system 21 may not be adapted to measure the position of the substrate W when it is still supported by the pins 18. Therefore, an additional or alternative alignment system could be provided to detect the position of the substrate W on the pins 18.

Figure 4:
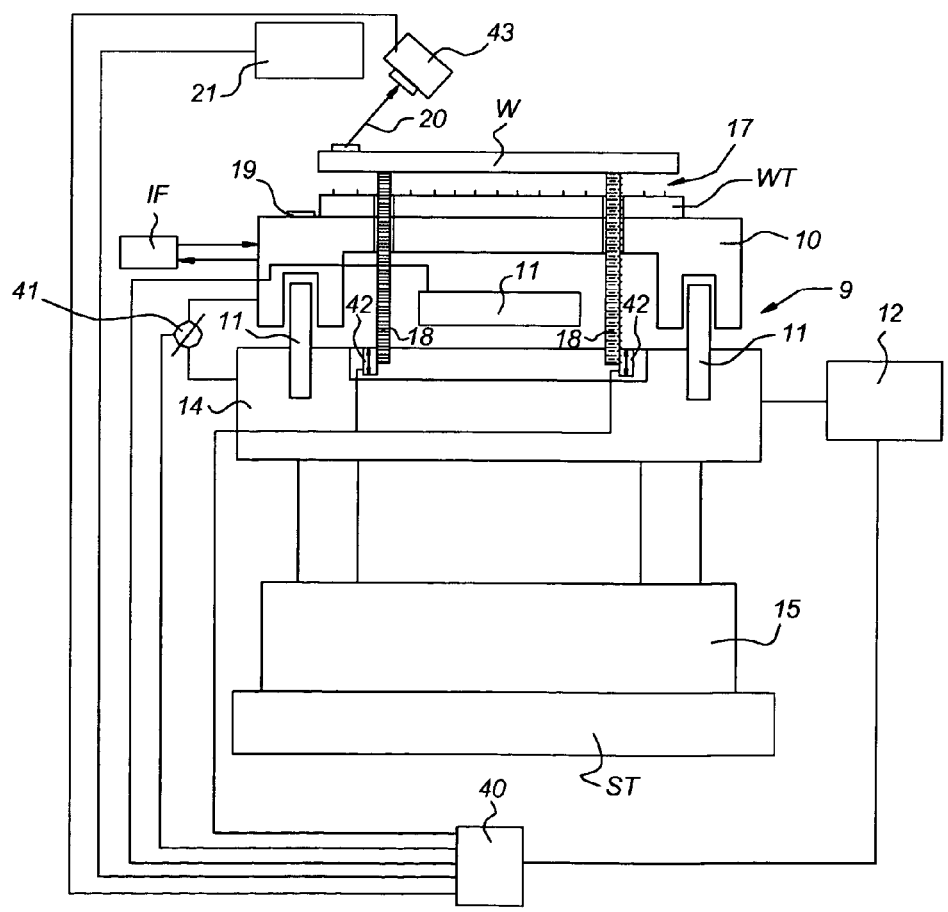
FIG. 4 depicts a schematic side view of a substrate stage according to a further embodiment of the present invention.

An additional alignment system 43 can be provided as is shown in FIG. 4. Such an additional alignment system 43 also determines the position of the substrate W with respect to the substrate table/holder WT, but only does this with a relatively rough accuracy. This additional alignment system is only provided to bring the mark(s) 19 of the substrate W within the sensing range of the more accurate first alignment system 21. In order to do so, the additional alignment sensor 43 is also connected to the processing unit 40.

The additional alignment system 43 can be provided by a CCD-camera, monitoring the position of the mark(s) 19. However, also other alignment systems can be used, such as a contour measurement system, as will be known to a person skilled in the art.

It should be noted that the above-mentioned embodiments illustrate rather than limit the invention, and that those skilled in the art will be able to design alternatives without departing from the scope of the appended claims. As such, while specific embodiments of the invention have been described above, it will be appreciated that the invention may be practiced otherwise than as described. The description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method for positioning a substrate relative to a substrate holder, comprising:

determining a first relative position of the substrate with respect to the substrate holder when the substrate is positioned relative to the substrate holder for a first time;

determining a second relative position of the substrate with respect to the substrate holder when the substrate is positioned relative to the substrate holder a second time; and adjusting the position of the substrate holder with respect to the substrate based on the first and second relative positions, such that the second time the substrate is positioned relative to the substrate holder, the relative position is substantially the same as the first relative position.

2. The method of claim 1, wherein the second relative position of the substrate is determined after the substrate is delivered to the substrate holder, and wherein the method further comprises:

removing the substrate from the substrate holder, adjusting the position of the substrate holder with respect to the substrate based on the first and second relative positions, and delivering the substrate to the repositioned substrate holder.

3. The method of claim 2, wherein the substrate holder is provided with a displacement device that is configured to displace the substrate to and from the substrate holder and wherein the method further comprises:

removing the substrate from the substrate holder with the displacement device, adjusting the position of the substrate holder with respect to the displacement device and the substrate based on the first and second relative positions, and delivering the substrate to the repositioned substrate holder with the displacement device.

4. The method of claim 1, further comprising:

determining the second relative position of the substrate before the substrate is delivered onto the substrate holder, and adjusting the position of the substrate holder with respect to the substrate based on the first and second relative positions before the substrate is delivered to the substrate holder.

5. The method of claim 4, wherein the substrate holder is provided with a displacement device that is configured to displace the substrate to and from the substrate holder and wherein the method further comprises:

determining the second relative position of the substrate before the substrate is delivered to the substrate holder by the displacement device, and adjusting the position of the substrate holder with respect to the substrate before the substrate is delivered to the substrate holder by the displacement device.

6. The method of claim 4, wherein the position of the substrate on the substrate holder is measured using an alignment system and the relative position of the substrate before the substrate is delivered to the substrate holder is measured with an additional alignment system.

7. The method of claim 6, wherein the additional alignment system comprises a CCD camera.

8. The method of claim 1, wherein the position of the substrate holder is determined using an interferometric measurement device that cooperates with a mirror attached to at least one of a chuck and the substrate holder and wherein the position of the mirror with respect to the interferometric measurement system is chosen to be substantially perpendicular when the first relative position of the substrate with respect to the substrate holder is determined.

9. A device manufacturing method, comprising:

providing a substrate that is at least partially covered by a layer of radiation-sensitive material;

positioning the substrate relative to a substrate holder, wherein the positioning comprises:

determining a first relative position of the substrate with respect to the substrate holder when the substrate is positioned relative to the substrate holder for a first time;

determining a second relative position of the substrate with respect to the substrate holder when the substrate is positioned relative to the substrate holder for a second time; and adjusting the position of the substrate holder with respect to the substrate based on the first and second relative positions, such that the second time the substrate is positioned relative to the substrate holder, the relative position is substantially the same as the first relative position;

conditioning a beam of radiation using a radiation system;

providing a support configured to support a patterning device;

configuring the beam of radiation with a desired pattern in its cross-section based on the patterning device; and projecting the patterned beam of radiation onto a target area of the layer of radiation-sensitive material.

10. An apparatus for positioning a substrate, comprising a substrate holder configured to hold the substrate;

a carrier including a displacement device that is configured to displace the substrate to and from the substrate holder;

a positioning device that is configured to displace the substrate holder relative to the carrier; and an alignment system configured to determine a first relative position of the substrate with respect to the substrate holder when the substrate is positioned relative to the substrate holder for a first time and to determine a second relative position of the substrate with respect to the substrate holder when the substrate is positioned relative to the substrate holder a second subsequent time, wherein the positioning device is configured to adjust the position of the substrate holder with respect to the substrate based on the first and second relative positions, such that the second time the substrate is positioned relative to the substrate holder it is substantially the same as the first relative position.

11. The apparatus of claim 10, wherein:

the alignment system is further configured to determine the second relative position of the substrate before the substrate is delivered onto the substrate holder, and the positioning device is further configured to adjust the position of the substrate holder with respect to the substrate based on the first and second relative positions before the substrate is delivered to the substrate holder.

12. The apparatus of claim 10, wherein:

the alignment system is further configured to determine the second relative position of the substrate on the displacement device before the substrate is delivered to the substrate holder by the displacement device, the positioning device is further configured to adjust the position of the substrate holder with respect to the substrate while the substrate is removed from the substrate holder by the displacement device, and the displacement device is configured to deliver the substrate to the repositioned substrate holder.

13. The apparatus of claim 10, wherein the position of the substrate on the substrate holder is measured using the alignment system and the relative position of the substrate before the substrate is delivered to the substrate holder is measured with an additional alignment system.

14. The apparatus of claim 13, wherein the additional alignment system comprises a CCD camera.

15. The apparatus of claim 10, wherein the second relative position of the substrate is determined after the substrate is delivered to the substrate holder and:
   the displacement device is configured to remove the substrate from the substrate holder,
   the positioning device is further configured to adjust the position of the substrate holder with respect to the substrate based on the first and second relative positions while the substrate is removed from the substrate holder by the displacement device, and
   the displacement device is configured to deliver the substrate to the repositioned substrate holder.

16. The apparatus of claim 10, wherein the substrate holder comprises a support structure formed by a plurality of pimples.

17. A lithographic apparatus, comprising:
   a radiation system configured to condition a beam of radiation;
   a support structure configured to support a patterning device that imparts a desired pattern to the beam of radiation;
   a substrate holder configured to hold a substrate; and
   a projection system configured to project the patterned beam onto a target portion of the substrate; and
   a substrate positioning apparatus, comprising:
      a carrier including a displacement device that is configured to displace the substrate to and from the substrate holder;
      a positioning device that is configured to displace the substrate holder relative to the carrier; and
      an alignment system configured to determine a first relative position of the substrate with respect to the substrate holder when the substrate is positioned relative to the substrate holder for a first time and to determine a second relative position of the substrate with respect to the substrate holder when the substrate is positioned relative to the substrate holder a second subsequent time,
      wherein the positioning device is configured to adjust the position of the substrate holder with respect to the substrate based on the first and second relative positions, such that the second time the substrate is positioned relative to the substrate holder it is substantially the same as the first relative position.

* * * * *